(12) United States Patent
Gill

(10) Patent No.: US 11,480,633 B2
(45) Date of Patent: Oct. 25, 2022

(54) COMPASS INCLUDING MAGNETIC FIELD SENSOR

(71) Applicant: Gill Corporate Limited, Hampshire (GB)

(72) Inventor: Michael John Gill, Hampshire (GB)

(73) Assignee: Gill Corporate Limited, Hampshire (GB)

( * ) Notice: Subject to any disclaimer, the term of this patent is extended or adjusted under 35 U.S.C. 154(b) by 599 days.

(21) Appl. No.: 16/493,000

(22) PCT Filed: Dec. 27, 2017

(86) PCT No.: PCT/EP2017/025373
§ 371 (c)(1),
(2) Date: Sep. 11, 2019

(87) PCT Pub. No.: WO2018/137750
PCT Pub. Date: Aug. 2, 2018

(65) Prior Publication Data
US 2020/0064415 A1    Feb. 27, 2020

(30) Foreign Application Priority Data

Jan. 26, 2017   (GB) ..................................... 1701297

(51) Int. Cl.
*G01R 33/04* (2006.01)
*G01C 17/38* (2006.01)
*G01R 33/09* (2006.01)

(52) U.S. Cl.
CPC ............. *G01R 33/04* (2013.01); *G01C 17/38* (2013.01); *G01R 33/091* (2013.01)

(58) Field of Classification Search
CPC ....... G01R 33/04; G01R 33/091; G01C 17/38
See application file for complete search history.

(56) References Cited

U.S. PATENT DOCUMENTS 5,046,260 A * 9/1991 Wellhausen ........... G01C 17/28
 33/356
5,091,697 A * 2/1992 Roth .................... G01R 33/045
 324/253
537,038 A 7/1996 Ando
(Continued)

FOREIGN PATENT DOCUMENTS

EP          0 227 888       7/1987
EP          2 075 814       7/2009
JP          2014-071101     4/2014

*Primary Examiner* — Mischita L Henson
(74) *Attorney, Agent, or Firm* — Clark & Brody LP

(57) ABSTRACT

A compass includes a magnetic sensing element in the form of a coil surrounding magnetic material. Electric current is supplied to the coil in opposite directions, depending on the state of switches operated at times $T_0$, for a first direction, and $T_5$, for a reverse current direction. A voltmeter measures voltages across the coil, namely at least $V_1$ at time $T_1$, after $T_0$, and $V_2$ at time $T_2$, after $T_5$, with $T_1-T_0=T_2-T_5$=predetermined $\Delta T$. A processor indicates $V_1-V_2$, the magnitude and sign of which indicate the strength and direction of the earth's magnetic field respectively.

6 Claims, 4 Drawing Sheets

(56) References Cited

U.S. PATENT DOCUMENTS

| | | |
|---|---|---|
| 239,365 A1 | 1/2016 | Fujikura |
| 2008/0292044 A1 | 11/2008 | Saito et al. |
| 2011/0101975 A1* | 5/2011 | Popovic ............... G01R 33/072 |
| | | 324/251 |
| 2013/0214777 A1 | 8/2013 | Itoi |
| 2015/0048820 A1 | 2/2015 | Schaffer et al. |
| 2016/0109533 A1 | 4/2016 | Oikawa |
| 2016/0245878 A1 | 8/2016 | Hwang et al. |

\* cited by examiner

COMPASS INCLUDING MAGNETIC FIELD SENSOR

The present invention relates to a magnetic compass including a magnetic field sensor for determining the strength and/or direction of a component of an ambient planetary magnetic field, comprising electrical circuitry which incorporates a magnetic sensing element, a voltmeter connected in the circuitry to provide a measure of the voltage across the magnetic sensing element, an electrical energy supply connector connected to the magnetic sensing element to supply an electrical current which passes through that element when the sensor is in use, and switches to reverse the direction of the flow of electrical current through the magnetic sensing element between successive measurements of the said voltage by the said voltmeter.

In one such magnetic field sensor which has already been proposed, the magnetic sensing element comprises a flux meter in which the current is passed through a primary winding, and the voltage is measured across a secondary winding. This requires a measurement of peak voltages which is of limited accuracy.

Another such magnetic field sensor is disclosed in U.S. Pat. No. 5,757,184. In that sensor, a measurement is made of the time it takes for a response waveform to rise to a pre-determined threshold, and this measurement also is of limited accuracy.

The present invention seeks to provide a remedy.

Accordingly, a first aspect of the present invention is directed to a magnetic field sensor having the construction set out in the opening paragraph of the present specification, characterised in that the magnetic sensing element comprises a coil surrounding magnetic material, in that the electrical energy source connector and the said switches are connected to the said coil, in that the voltmeter is connected to measure the voltage across the said coil, and in that the circuitry further comprises a timer connected within the circuitry to cause the voltmeter to provide measurements $V_1$ and $V_2$ respectively at times $T_1$ and $T_2$ which occur after successive operations of the switches respectively at times $T_0$ and $T_5$, to initiate the passage of electrical current through the coil in respective opposite directions, such that $T_1-T_0=T_2-T_5=\Delta T$, where $\Delta T$ is a predetermined period of time, and a processor connected in the circuitry to provide an indication of the value of $V_1-V_2$, the magnitude of which provides an indication of the strength of the said component, and the sign of which provides an indication of the direction of the said component.

The timer may be a part or parts of the processor, which may be a microprocessor. This enables economy of manufacture.

The switches may be parts of the processor or microprocessor. Again, this affords an economy of parts in the manufacture of the sensor.

The timer may be provided with a memory in which is retained the value of $\Delta T$. Again, this affords an economy of parts.

The voltmeter may comprise an amplifier connected in series with an analogue-to-digital converter between the magnetic sensing element and the processor or microprocessor, and the voltmeter may be made as an integral part or parts of the microprocessor, again for economy of parts.

The present invention extends to a compass provided with a magnetic field sensor in accordance with the present invention.

According to a second aspect of the present invention, there is provided a method of determining the strength and/or direction of a component of an ambient magnetic field, comprising obtaining a measure of the voltage $V_1$ across a magnetic sensing element, in the form of a coil surrounding magnetic material, of electrical circuitry of a magnetic field sensor by means of a voltmeter of the electrical circuitry at a time $T_1$ after a time $T_0$ when an electrical current through the coil in a first direction is initiated by switches of the circuitry, using a timer to equate $T_1-T_0$ to a predetermined period $\Delta T$, and obtaining a measure of the voltage $V_2$ across the coil at a time $T_2$ after a time $T_5$ when an electrical current through the coil in the direction opposite to the said first direction is initiated by the switches, equating $T_2-T_5$ to the predetermined period $\Delta T$, and using a processor of the circuitry to provide an indication of the value of $V_1-V_2$, the magnitude of which provides an indication of the strength of the said component, and the sign of which provides an indication of the direction of the said component.

The present invention extends to such a method using a sensor or a compass as set out in any one of the foregoing paragraphs between the one commencing "According to a first aspect" and the one commencing "According to a second aspect".

Examples of a sensor, compass and method embodying the present invention will now be described in greater detail with reference to the accompanying drawings, in which.

Figure 1:
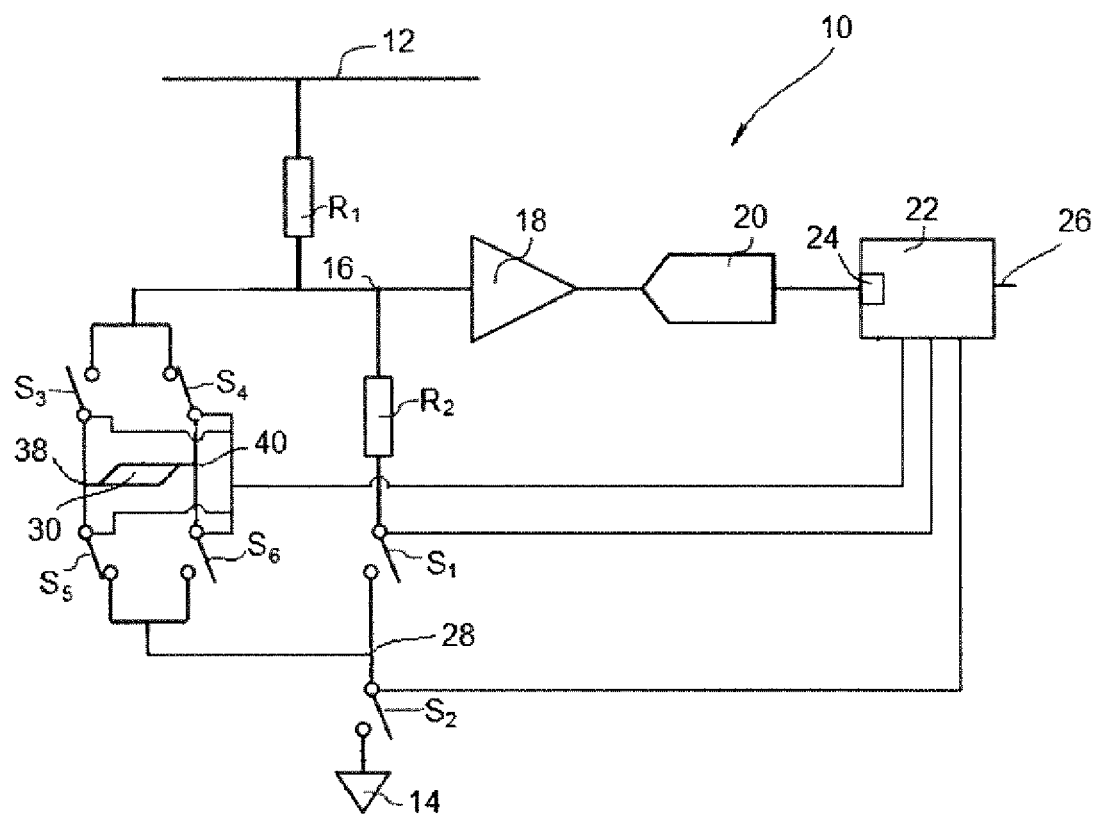
FIG. 1 shows a circuit diagram of a sensor embodying the present invention.

The magnetic field sensor 10 shown in FIG. 1 comprises an electrical energy source connector 12 for connecting the sensor 10 to a source of electrical energy (not shown) at voltage V, and an earth connector 14 for connecting the sensor 10 to earth or equivalent. Between the connectors 12 and 14, from the connector 12 to the connector 14, are two resistances $R_1$ and $R_2$ connected in series with one another, followed by two switches $S_1$ and $S_2$ also connected in series with one another.

The interconnection 16 between the resistors R1 and R2 is connected to the input of an amplifier 18 the output from which is connected to the input of an analogue to digital converter 20, the output from which is connected to an input of a microprocessor 22 via a timer 24. An output 26 of the microprocessor 22 provides a digital output which can be connected to any other digital system, for example a meteorological system (not shown), or a navigation system (not shown).

Connected across the interconnection 16 and the interconnection 28 between the switches $S_1$ and $S_2$ is a magnetic sensing element 30, via switches $S_3$, $S_4$, $S_5$, and $S_6$.

Figure 2:
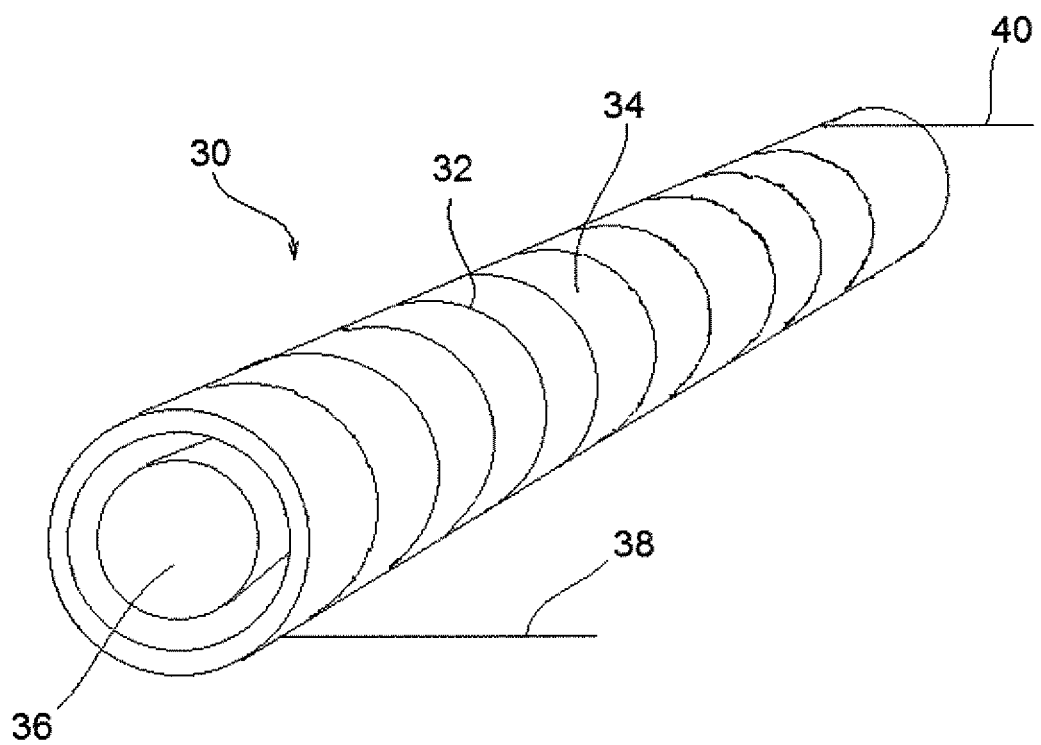
FIG. 2 shows a perspective end view of a magnetic sensing element of the circuitry shown in FIG. 1.

As shown in FIG. 2, the magnetic sensing element 30 comprises a coil 32 wound around and along a hollow cylindrical non-electrically conductive non-magnetic former 34 within and along the interior of which extends a solid cylindrical core 36 of a ferromagnetic material such as iron.

The coil has opposite ends 38 and 40 respectively connected to the interconnections (a) between switches $S_3$ and $S_5$ and (b) between switches $S_4$ and $S_6$. One side of each of the switches $S_3$ and $S_4$ is connected to the interconnection 16, and the other sides of the switches $S_3$ and $S_4$ are connected respectively to the ends 38 and 40 of the coil 32. Similarly, one side of each of the switches $S_5$ and $S_6$ is connected to the interconnection between the switches $S_1$ and $S_2$, and the other sides of the switches $S_5$ and $S_6$ are connected respectively to the ends 38 and 40 of the coil 32.

All the switches $S_1$ to $S_6$ are simple on-off switches connected to the microprocessor 22 for control thereby.

The magnetic sensing element 30 is one of three (the other two of which are not shown) each mounted orthogonally relative to the other two, and each with circuitry as shown in FIG. 1 but sharing a common microprocessor 22 which addresses the three elements cyclically. Signals from the three sensors taken together are used in a manner known in itself to provide an indication of the strength and direction of the ambient magnetic field, as described for example with reference to FIG. 20 of U.S. Pat. No. 5,757,184.

With the connector 12 connected to a source of energy so that it is held at voltage V, at time $T_0$ the microprocessor 22 sets switches $S_2$, $S_4$ and $S_5$ closed, and switches $S_3$, $S_6$ and $S_1$ open. After a predetermined period of time set by the microprocessor 22, at time $T_3$, switch $S_2$ remains closed and switch $S_1$ remains open, but the conditions of all the other switches $S_3$ to $S_6$ are reversed, so that simultaneously switches $S_3$ and $S_6$ are closed, and switches $S_4$ and $S_5$ are opened. At time $T_4$, being a predetermined period after time $T_3$ equal to or about equal to the period between times $T_0$ and $T_3$, the conditions of switches $S_3$ to $S_6$ remain unchanged, but the conditions of switches $S_1$ and $S_2$ are reversed, so that switch $S_2$ is opened and switch $S_1$ is closed.

At time $T_5$, being after time $T_4$ by a period also about equal to that between times $T_0$ and $T_3$, the conditions of switches $S_3$ to $S_6$ again remain unchanged, but the conditions of the switches $S_1$ and $S_2$ are reversed again back to the condition they had between times $T_0$ and $T_3$.

Upon completion of a further period after time $T_5$, about the same as that between times $T_0$ and $T_2$, at time $T_6$, the conditions of the switches $S_1$ and $S_2$ remain unaltered, but those of switches $S_3$ to $S_6$ are reversed back to the condition they had between times $T_0$ and $T_3$.

Upon completion of a further such period after time $T_6$, at time $T_7$, the conditions of switches $S_3$ to $S_6$ remain unchanged, but those of switches $S_1$ and $S_2$ are once again reversed. Finally, after a further such period, the conditions of switches $S_3$ to $S_6$ remain unchanged, but the conditions of switches $S_1$ and $S_2$ are reversed to re-commence this cycle of switching the switches $S_1$ to $S_6$.

Figure 3:
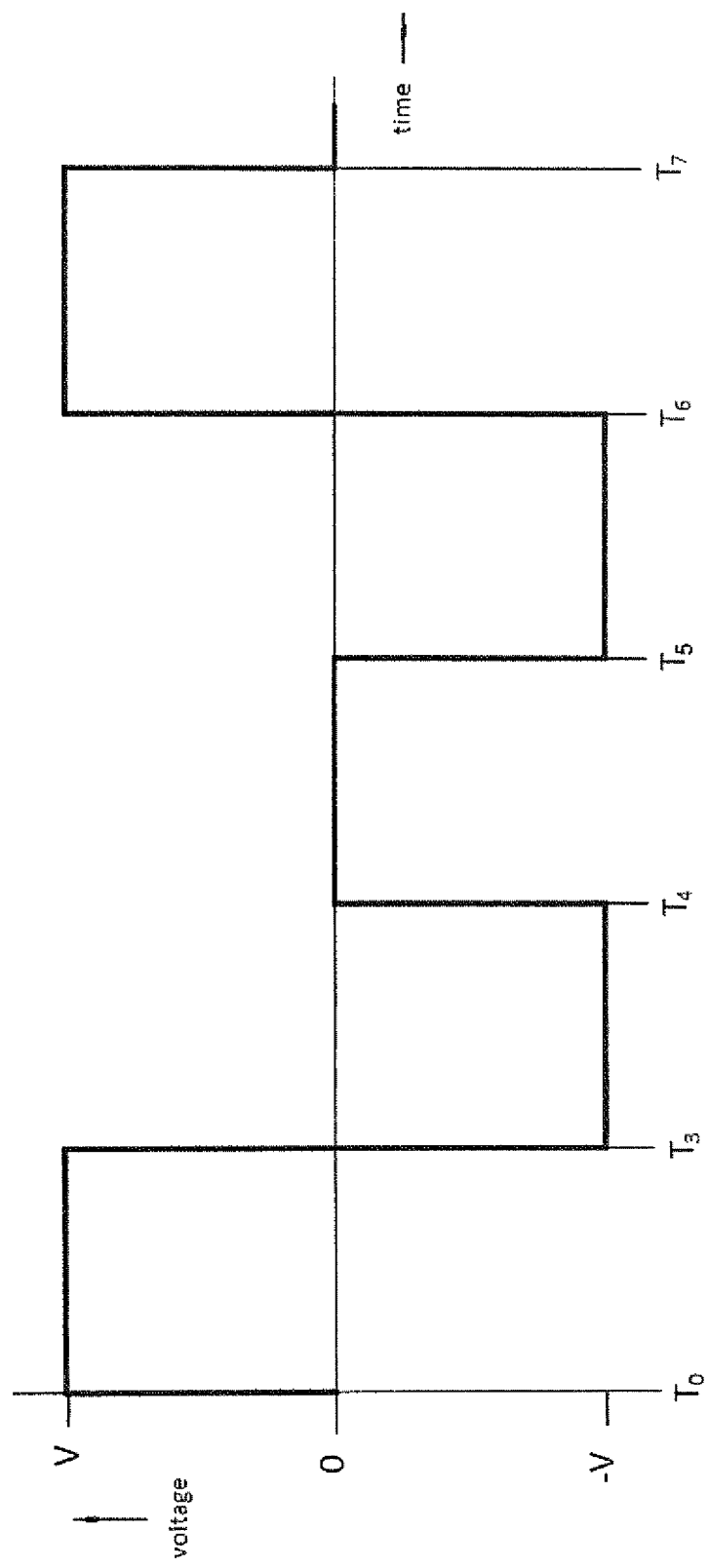
FIGS. 3 to 5 show respective explanatory graphs.

It will be appreciated that the resulting voltage applied across the combination of resistor $R_1$ and the magnetic sensing element 30, with the direction of the voltage being dependent on the direction of this applied voltage relative to the coil 32, is as shown in FIG. 3.

Figure 4:
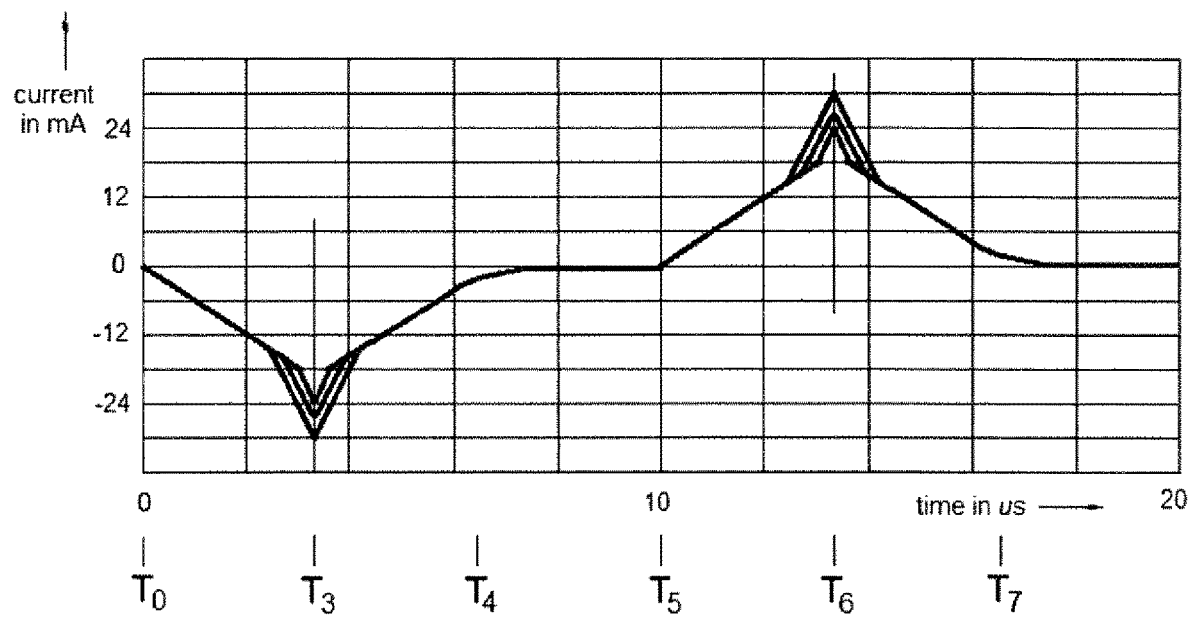

During successive cycles, the current flowing through the coil 32 is as shown in FIG. 4. Which of the troughs and peaks shown at times $T_3$ and $T_6$ actually occurs, at around the time when the direction of applied voltage is reversed, depends upon the strength and direction of the ambient magnetic field.

Thus, during the period from $T_0$ to $T_3$, the negative current passing through the coil 32 steadily increases as more and more of the respective magnetic fields of the magnetic domains in the core 36 align themselves with the magnetic field generated within the coil 32 by the electrical current passing through it. The current is considered negative because of the direction of flow of the current through the coil at this stage, so that an increase in the negative current is indicated by a fall in the plot of current as a function of time in the graph shown in FIG. 4. When the magnetisation of the core 36 is saturated, the negative electrical current increases at an even greater rate. The point in time at which this happens will be dependent upon the ambient magnetic field, because that field will itself cause a certain degree of alignment or anti-alignment of the magnetic fields of those domains.

At the time $T_3$, the direction of the current through the coil 32 is reversed, and the plot of current against time reverses so that the plot of current versus time at this stage is more or less symmetrical about time $T_3$. This is so until the magnetic energy stored in the core 36 is almost zero at time $T_4$ when the ends of the coil 32 are connected across the resistor $R_2$ to completely remove the energy at which point the current passing through the coil 32 is zero.

The next half of the cycle of switching results in a similar process but with the current passing in a positive direction through the coil 32, so that the plot of current versus time in the right-hand side of FIG. 4 is a vertical inversion of the plot of current versus time in the left-hand side of that Figure. However, for any non-zero value of the ambient magnetic field, it will be appreciated that the size of the negative peak and the positive peak at times $T_3$ and $T_6$ will be different for any actual plot of current versus time. In other words, the time it takes for saturation of the core 36 to be reached will be different for one direction of current flow than it is for the opposite direction of current flow.

Figure 5:
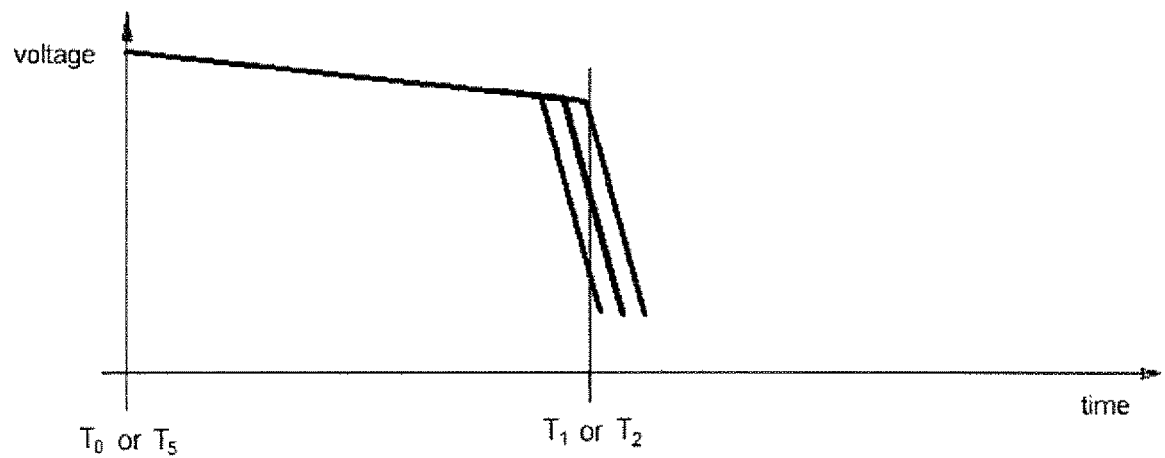

FIG. 5 shows a graph of the voltage at the interconnection 16 plotted against time. Which of the steeper falls at the right hand side of the plot actually occurs again depends upon the strength and direction of the ambient magnetic field. Because of the linearity of the function, and the spacing between successive steep lines corresponding to equal increments of strength in the ambient magnetic field, it can be seen that the value of the voltage at a time passed by all the steep lines varies in proportion to the strength of that field, in fact in inverse proportion, so that the stronger the ambient magnetic field, the lower the measured voltage at that time.

The actual times at which the voltage at interconnection 16 is made are at times $T_1$ and $T_2$, respectively at equal periods of time $\Delta T$ after times $T_0$ and $T_5$, respectively just before times $T_3$ and $T_6$ when the applied voltage is reversed.

The period $\Delta T$ is stored in the timer 24, which is restarted on every occurrence of the times $T_0$ and $T_5$ in each cycle. When the count in the timer 24 equals $\Delta T$, the value of the voltage at interconnection 16 is read by the microprocessor 22 from the input it receives from the analogue to digital converter 20. The microprocessor 22 then calculates the value of the difference between two successive readings. The magnitude of the difference between two successive readings gives the strength of the component of the ambient magnetic field which is in alignment with the axis of the coil 32, and the sign of the difference gives the direction of that component.

With measurements from the three mutually orthogonal magnetic sensing elements 30, the microprocessor 22 programmed in a manner known in itself to cause the display 26 to display the direction of North, being the direction in which the field is indicated to be strongest and of the appropriate sign, the sensor acts as a compass.

Numerous variations and modifications to the illustrated sensor may occur to the reader without taking the resulting construction outside the scope of the present invention. For example, the switches $S_1$ to $S_6$, the resistors $R_1$ and $R_2$, the amplifier 18 and the analogue to digital converter 20 could all be incorporated in the microprocessor 22.

The invention claimed is:

1. A compass including a magnetic field sensor for determining the strength and/or direction of a component of a planetary magnetic field, comprising:

a magnetic sensing element, a voltmeter providing a measure of the voltage across the magnetic sensing element, an electrical energy supply connector connected to the magnetic sensing element to supply an electrical current which passes through that the magnetic sensing element element when the sensor is in use, and switches to reverse the direction of the flow of the electrical current through the magnetic sensing element between successive measurements of the said voltage by the said voltmeter, wherein the magnetic sensing element comprises a coil surrounding magnetic material, the electrical energy supply connector and the said switches are connected to the coil, the voltmeter is connected to measure the voltage across the coil, and a timer to cause the voltmeter to provide measurements $V_1$ and $V_2$ respectively at times $T_1$ and $T_2$, which occur after successive operations of the switches, respectively, at times $T_0$ and $T_5$, to initiate the passage of electrical current through the coil in respective opposite directions, such that $T_1-T_0=T_2-T_5=\Delta T$, where $\Delta T$ is a predetermined period of time; and said compass further comprising a processor to provide an indication of the value of $V_1-V_2$, the magnitude of which provides an indication of the strength of the said component, and the sign of which provides an indication of the direction of the said component.

2. A compass including a magnetic field sensor according to claim 1, wherein the timer is a part or parts of the processor, especially but not exclusively a microprocessor.

3. A compass including a magnetic field sensor according to claim 1, wherein the switches are parts of the processor or microprocessor.

4. A compass including a magnetic field sensor according to claim 1, wherein the voltmeter is a part or parts of the processor or microprocessor.

5. A compass including a magnetic field sensor according to claim 1, wherein the timer is provided with a memory in which is retained the value of $\Delta T$.

6. A compass including a magnetic field sensor according to claim 1, wherein the voltmeter comprises an amplifier connected in series with an analogue-to-digital converter between the magnetic sensing element and the processor or microprocessor.

\* \* \* \* \*